(12) United States Patent
Hsu et al.

(10) Patent No.: US 9,362,314 B2
(45) Date of Patent: Jun. 7, 2016

(54) THIN FILM TRANSISTOR SUBSTRATE

(71) Applicant: INNOLUX CORPORATION, Chu-Nan, Miao-Li County (TW)

(72) Inventors: Hsu-Kuan Hsu, Chu-Nan (TW); Kuo-Hao Chiu, Chu-Nan (TW); Hsia-Ching Chu, Chu-Nan (TW); Peng-Cheng Huang, Chu-Nan (TW); Ming Chien Sun, Chu-Nan (TW)

(73) Assignee: INNOLUX CORPORATION, Jhu-Nan (TW)

( * ) Notice: Subject to any disclaimer, the term of this patent is extended or adjusted under 35 U.S.C. 154(b) by 0 days.

(21) Appl. No.: 14/462,232

(22) Filed: Aug. 18, 2014

(65) Prior Publication Data

US 2015/0357354 A1     Dec. 10, 2015

(30) Foreign Application Priority Data

Jun. 6, 2014   (TW) .............................. 103119692 A

(51) Int. Cl.

| H01L 27/12 | (2006.01) |
| H01L 29/786 | (2006.01) |
| G02F 1/1368 | (2006.01) |
| H01L 23/522 | (2006.01) |

(52) U.S. Cl.
CPC .......... *H01L 27/1225* (2013.01); *G02F 1/1368* (2013.01); *H01L 23/5226* (2013.01); *H01L 27/124* (2013.01); *H01L 29/7869* (2013.01)

(58) Field of Classification Search
CPC ................................................. H01L 23/5283
See application file for complete search history.

(56) References Cited

U.S. PATENT DOCUMENTS

| 7,466,389 | B2 * | 12/2008 | Nomura ................ G02F 1/1345 349/138 |
| 8,860,026 | B2 * | 10/2014 | Huang ................ H01L 27/1214 257/59 |
| 2015/0116623 | A1 * | 4/2015 | Tomioka ............... G02F 1/1368 349/43 |
| 2015/0160521 | A1 * | 6/2015 | Tomioka ........... G02F 1/133512 349/110 |

FOREIGN PATENT DOCUMENTS

TW          200702794         1/2007

* cited by examiner

*Primary Examiner* — Stephen W Smoot
(74) *Attorney, Agent, or Firm* — Liu & Liu

(57) ABSTRACT

A thin film transistor substrate is disclosed, which comprises: a substrate; and plural thin film transistor (TFT) units, an insulating layer, a pixel electrode and an alignment layer sequentially disposed thereon. The TFT units comprise a gate insulating layer, an active layer and source and drain electrodes; the insulating layer has contact vias to expose the drain electrodes of the TFT units; and the pixel electrode is disposed on the insulating layer and extents to the contact vias to electrically connect with the drain electrodes. Herein, a side wall of at least one of the contact vias has a first inclined portion at a first direction and a second inclined portion at a second direction, the first direction is different from the second direction, and an inclination of the pixel electrode on the first inclined portion is different from that on the second inclined portion.

21 Claims, 8 Drawing Sheets

THIN FILM TRANSISTOR SUBSTRATE

CROSS REFERENCE TO RELATED APPLICATION

This application claims the benefits of the Taiwan Patent Application Serial Number 103119692, filed on Jun. 6, 2014, the subject matter of which is incorporated herein by reference.

BACKGROUND OF THE INVENTION

1. Field of the Invention

The present invention relates to a thin film transistor (TFT) substrate and, more particularly to a TFT substrate capable of reducing light leakage of a display panel.

2. Description of Related Art

In recent years, all the display devices are developed toward having small volume, thin thickness and light weight as the display techniques progresses. A liquid crystal display (LCD) device is a flat panel display device with a thin thickness, so a conventional cathode ray tube (CRT) display is gradually replaced by the LCD. Especially, the LCD can be applied to various fields. For example, the daily used devices such as cell phones, notebooks, video cameras, cameras, music players, navigation devices, and televisions are equipped with liquid crystal display (LCD) panels.

In the LCD panel used nowadays, the rotation of liquid crystal molecules is controlled by TFT units on the TFT substrate to obtain the effect of showing bright and dark states. However, the light may reflect in contact vias of the TFT units, resulting in light leakage; and this light leakage is one factor causing the display quality of the LCD panels reduced.

Hence, in order to improve the display quality of the LCD panels, all the manufacturers are desired to develop improved LCD panels in which the problem of light leakage can be reduced to satisfy the customers' requirements for high display quality. Therefore, it is desirable to provide a TFT substrate for a LCD panel, which can solve the problem of light leakage to accomplish the purpose of improving display quality of the LCD panel.

SUMMARY OF THE INVENTION

An object of the present invention is to provide a TFT substrate, and therefore a light leakage occurred in a display panel manufactured with the same can be reduced.

To achieve the abject, an aspect of the present invention is to provide a TFT substrate, which comprises: a substrate; and plural thin film transistor (TFT) units, an insulating layer, pixel electrodes and an alignment layer sequentially disposed thereon. The TFT units disposed on the substrate respectively comprise a gate insulating layer, an active layer, a source electrode and a drain electrode. In addition, the insulating layer is disposed on the TFT units and has contact vias to respectively expose the drain electrodes of the TFT units; the pixel electrodes are disposed on the insulating layer and respectively extent to the contact vias to electrically connect with the drain electrodes; and the alignment layer covers the pixel electrodes. Herein, a side wall of at least one of the contact vias has a first inclined portion at a first direction and a second inclined portion at a second direction, the first direction is different from the second direction, and a inclination of at least one of the pixel electrodes on the first inclined portion is different from that on the second inclined portion. In the present aspect, the material of the active layer is not particularly limited, and can be any semiconductor material known in the art, such as amorphous silicon and metal oxides (for example, IGZO). Preferably, the material of the active layer is IGZO.

Another aspect of the present invention is to provide another TFT substrate, which comprises: a substrate; and plural TFT units, an insulating layer, pixel electrodes and an alignment layer sequentially disposed thereon. The TFT units disposed on the substrate respectively comprise a gate insulating layer, an active layer, a source electrode and a drain electrode. In addition, the insulating layer is disposed on the TFT units and has contact vias to respectively expose the drain electrodes of the TFT units; the pixel electrodes are disposed on the insulating layer and respectively extent to the contact vias to electrically connect with the drain electrodes; and the alignment layer covers the pixel electrodes. Herein, at least one of the contact vias respectively has a middle bottom portion, the alignment layer is disposed in the contact vias, and the alignment layer on at least one of the middle bottom portions of the contact vias has a porous structure. In the present aspect, the material of the active layer is not particularly limited, and can be any semiconductor material known in the art, such as amorphous silicon and metal oxides (for example, IGZO).

Another aspect of the present invention is to provide another TFT substrate, which comprises all the technical features mentioned in both the aspects illustrated above.

In all the TFT substrates illustrated in the aforementioned aspects of the present invention, the first direction and the second direction may be different. Preferably, an angle included between the first direction and the second direction is in a range from 85° to 90°. More preferably, the first direction is substantially vertical to the second direction.

In all the TFT substrates illustrated in the aforementioned aspects of the present invention, an angle included between the first direction and a scan line electrically connecting to the TFT unit is in a range from 0° to 5°, and an angle included between the second direction and a data line electrically connecting to the TFT unit is in a range from 0° to 5°. Preferably, the first direction is substantially parallel to the scan line, and the second direction is substantially parallel to the data line. In this case, an inclination of at least one of the pixel electrodes on the first inclined portion is larger than that on the second inclined portion.

In all the TFT substrates illustrated in the aforementioned aspects of the present invention, the "inclination" can be defined as a "slope". More specifically, a first contact point and a second contact point are respectively formed by crossing an extension line of an insulating surface of the insulating layer with an electrode surface of the pixel electrode in the contact via at a first direction and a second direction, a first reference point and a second reference point are respectively positioned on the electrode surface of the pixel electrode on the first inclined portion and the second inclined portion at a first predetermined height between the pixel electrode and the drain electrode, a slope of at least one pixel electrode on the first inclined portion is a connecting line between the first contact point and the first reference point, and another slope thereof on the second inclined portion is another connecting line between the second contact point and the second reference point. In all the TFT substrates illustrated in the aforementioned aspects of the present invention, the slope of at least one of the pixel electrodes on the first inclined portion is different from that on the second inclined portion. Preferably, a slope of at least one of the pixel electrodes on the first inclined portion is larger than that on the second inclined portion, when an angle included between the first direction and a scan line electrically connecting to the TFT unit is in a range from 0° to 5° or the first direction is substantially parallel to the scan line, and an angle included between the second direction and a data line electrically connecting to the TFT unit is in a range from 0° to 5° or the second direction is substantially parallel to the data line.

In all the TFT substrates illustrated in the aforementioned aspects of the present invention, the "inclination" also can be defined as a "curvature radius". More specifically, at both a first predetermined height and a second predetermined height different from the first predetermined height between the pixel electrode and the drain electrode, curvature radii of at least one of the pixel electrodes on the first inclined portion are different from those on the second inclined portion. Preferably, curvature radii of at least one of the pixel electrodes on the first inclined portion are smaller than those on the second inclined portion, at both the first predetermined height and the second predetermined height, when an angle included between the first direction and a scan line electrically connecting to the TFT unit is in a range from 0° to 5° or the first direction is substantially parallel to the scan line, and an angle included between the second direction and a data line electrically connecting to the TFT unit is in a range from 0° to 5° or the second direction is substantially parallel to the data line.

More preferably, in all the TFT substrates illustrated in the aforementioned aspects of the present invention, the pixel electrodes on the first inclined portion and the second inclined portion simultaneously satisfy the relations defined by the "slope" and the "curvature radius".

In all the TFT substrates illustrated in the aforementioned aspects of the present invention, at least one of the contact vias respectively has a middle bottom portion, and the alignment layer disposed on at least one of the middle bottom portions of the contact vias has a porous structure. Herein, a diameter of a pore in the porous structure is not particularly limited, and preferably in a range from 50 nm to 1000 nm.

In addition, in all the TFT substrates illustrated in the aforementioned aspects of the present invention, the alignment layer is disposed in the contact vias, and a roughness of the alignment layer disposed on the side walls of the contact vias is different from that of the alignment layer disposed in the middle bottom portion thereof.

Furthermore, the present invention further provides a liquid crystal display (LCD) panel, which comprises the aforementioned TFT substrate.

Other objects, advantages, and novel features of the invention will become more apparent from the following detailed description when taken in conjunction with the accompanying drawings.

DETAILED DESCRIPTION OF THE PREFERRED EMBODIMENT

The present invention has been described in an illustrative manner, and it is to be understood that the terminology used is intended to be in the nature of description rather than of limitation. Many modifications and variations of the present invention are possible in light of the above teachings. Therefore, it is to be understood that within the scope of the appended claims, the invention may be practiced otherwise than as specifically described.

Embodiment 1

Figure 1:
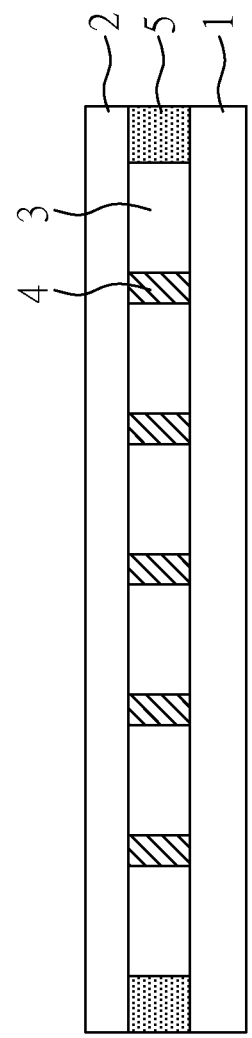
FIG. 1 is a perspective view of a LCD panel according to Embodiment 1 of the present invention.

As shown in FIG. 1, the LCD panel of the present embodiment comprises: a TFT substrate 1; a color filter (CF) substrate 2 opposite to the TFT substrate 1; plural spacers 4 disposed between the TFT substrate 1 and the CF substrate 2; a frame 5 disposed between the TFT substrate 1 and the CF substrate 2 and locating on peripheries of the TFT substrate 1 and the CF substrate 2; and a liquid crystal layer 3 disposed in a space formed by the TFT substrate 1 and the CF substrate 2. Hereinafter, a structure of the TFT substrate 1 is described in detail.

Figure 2:
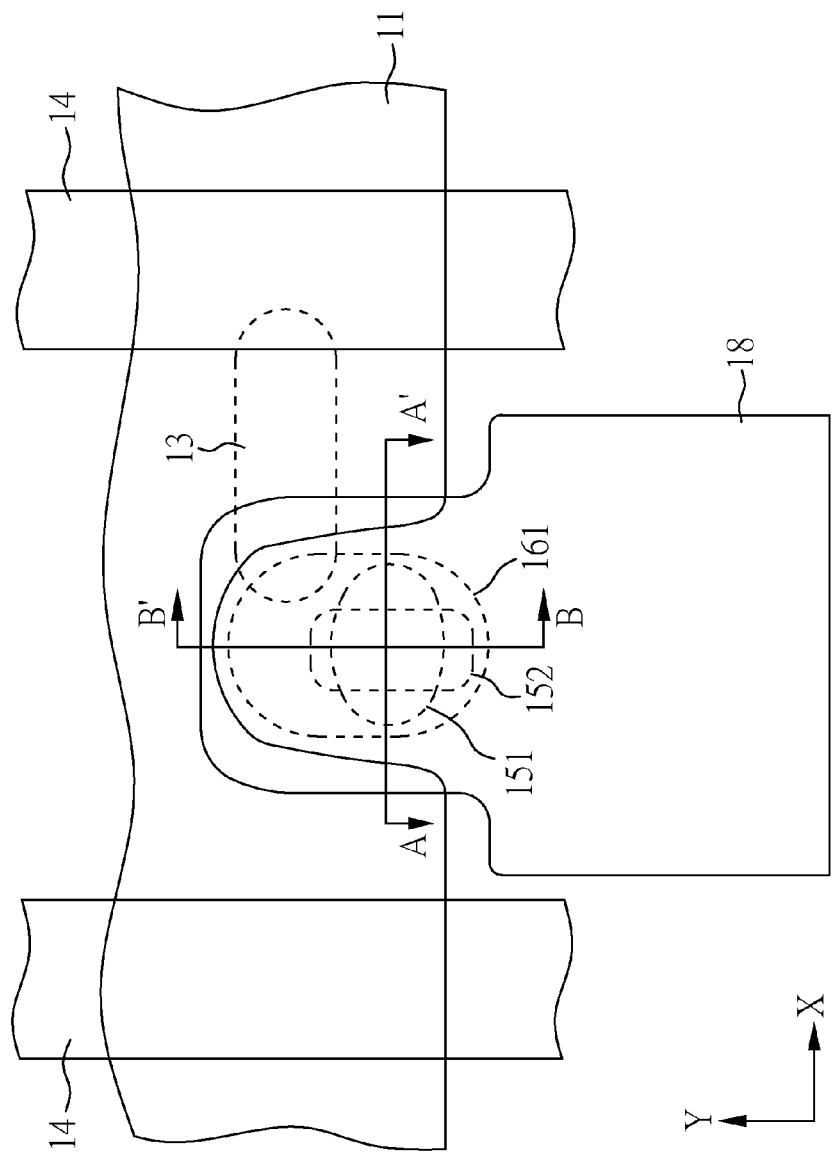
FIG. 2 is a perspective view showing a structure of a contact via exposing a drain electrode according to Embodiment 1 of the present invention.
Figure 3A:
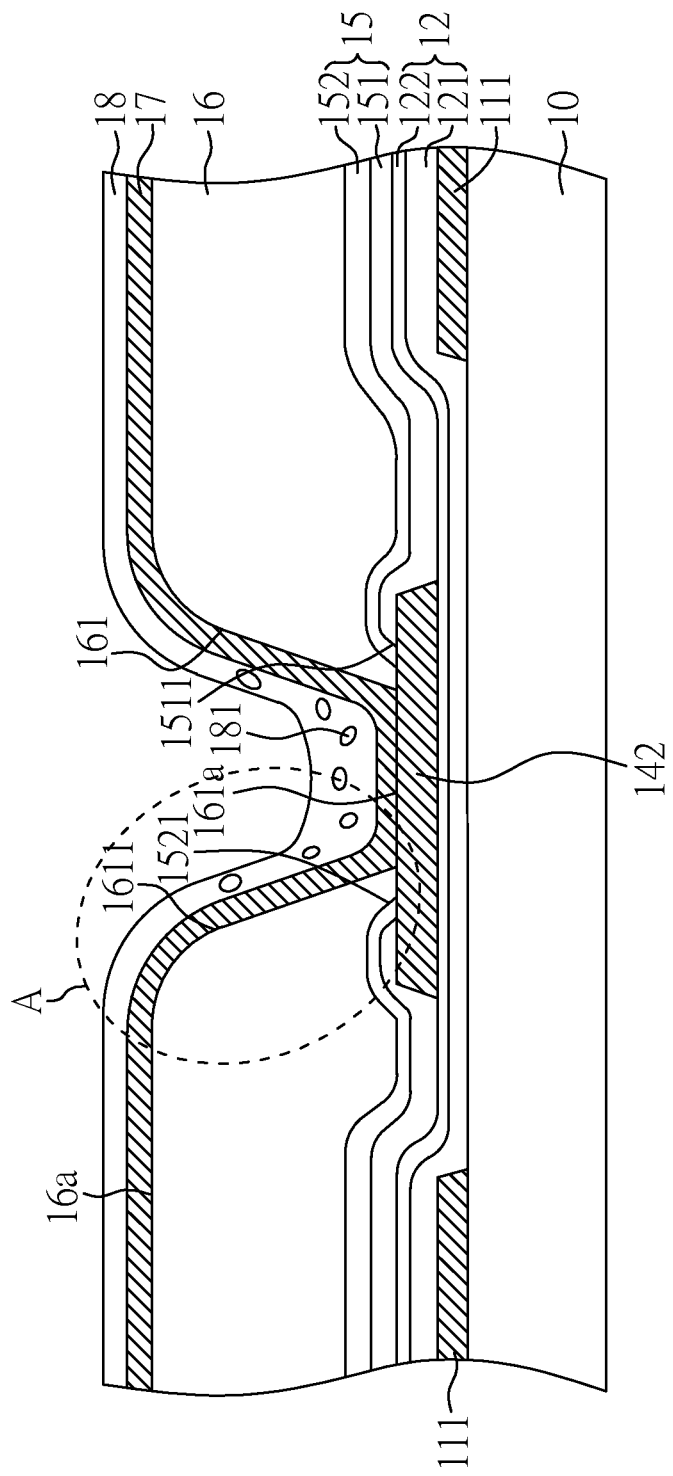
FIGS. 3A-3B are cross-sectional views showing a structure of a contact via exposing a drain electrode along A-A' and B-B' lines indicated in FIG. 2 according to Embodiment 1 of the present invention.

FIG. 2 is a perspective view showing a structure of a contact via exposing a drain electrode of the present Embodiment; and FIG. 3A is a cross-sectional view showing a structure of a contact via exposing a drain electrode along an A-A' line indicated in FIG. 2. As shown in FIGS. 2 and 3A, the TFT substrate of the present embodiment comprises: a substrate 10 with a scan line 11 and a gate electrode 111 formed by a first metal layer, a gate insulating layer 12, an active layer 13, a data line 14 and a source electrode (not shown in the figure) as well as a drain electrode 142 formed by a second metal layer, a first insulating layer 15, a second insulating layer 16, a pixel electrode 17 and an alignment layer 18 sequentially formed thereon. The gate electrode 111, the gate insulating layer 12, the active layer 13, and the source electrode (not shown in the figure) as well as a drain electrode 142 form a TFT unit of the present embodiment. Herein, as shown in FIG. 2, the scan line 11 is disposed along a first direction X; more specifically, an angle included between the first direction X and the scan line 11 electrically connecting to the TFT unit is in a range from 0° to 5°, and preferably the first direction X is substantially parallel to the scan line 11. In addition, the data line 14 is disposed along a second direction Y; more specifically, an angle included between the second direction Y and the data line 14 electrically connecting to the TFT unit is in a range from 0° to 5°, and preferably the second direction Y is substantially parallel to the data line 14. Furthermore, the first direction X is different from the second direction Y. In the present embodiment, an angle included between the first direction X and the second direction Y is in a range from 85° to 90°; and preferably, the first direction X is substantially vertical to the second direction Y.

As shown in FIG. 3A, the TFT substrate of the present embodiment comprises: the substrate 10, plural TFT units, an insulating layer comprising the first insulating layer 15 and the second insulating layer 16, the pixel electrode 17 and the alignment layer 18. Herein, the TFT units are disposed on the substrate 10 and respectively comprise: the gate electrode 111; the gate insulating layer 12 formed on the gate electrode 111 and the substrate 10; the active layer (not shown in the figure) disposed on the gate insulating layer 12; and the source electrode (not shown in the figure) as well as a drain electrode 142 disposed on the active layer (not shown in the figure). In addition, the insulating layer comprising the first insulating layer 15 and the second insulating layer 16 is disposed on the TFT units. The first insulating layer 15 and the second insulating layer 16 respectively have an opening 1521 and a contact via 161 to expose the drain electrode 142 of the TFT unit. The pixel electrode 17 is disposed on the first insulating layer 15 and the second insulating layer 16 and extends to the contact via 161 to electrically connect with the drain electrode 142. The alignment layer 18 covers the pixel electrode 17.

In the present embodiment, a bottom gate TFT unit is exemplified. However, in other embodiments of the present invention, other types of TFT units can also be applied to the TFT substrate of the present invention, such as a top gate TFT unit.

Herein, the first metal layer and the second metal layer can be prepared with any conductive material generally used in the art, such as metals, alloys, metal oxides, metal oxynitrides, or other electrode materials generally used in the art. Preferably, those units are prepared with metals. In the present embodiment, the first metal layer can be a composite metal layer formed with sequentially laminated Ta and W layers; and the second metal layer can also be a composite metal layer formed with sequentially laminated Ti, Al and Ti layers. In addition, the gate insulating layer 12 can be prepared with any insulating material generally used in the art. In the present embodiment, the gate insulating layer 12 is prepared by sequentially laminating a first gate insulating layer 121 formed with silicon nitride and a second gate insulating layer 122 formed with silicon oxide. Furthermore, the active layer 13 can be prepared with any semiconductor material generally used in the art. In the present embodiment, the material for the active layer 13 is IGZO. Meanwhile, in the present embodiment, the insulating layer on the second metal layer is formed by sequentially laminating the first insulating layer 15 and the second insulating layer 16. The material for the first insulating layer 15 can be any insulating material generally used in the art. Herein, the first insulating layer 15 is prepared by sequentially laminating a first protection layer 151 formed with silicon oxide and a second protection layer 152 formed with silicon nitride. The first protection layer 151 and the second protection layer 152 respectively have openings 1511, 1521 to expose the drain electrode 142 of the TFT unit. In addition, the material for the second insulating layer 16 can be any material for a planer layer generally used in the art, and the second insulating layer 16 has a contact via 161 to expose the drain electrode 142 of the TFT unit. In the present embodiment, the insulating layer on the second metal layer is formed by sequentially laminating the first insulating layer 15 and the second insulating layer 16. However, in other embodiments of the present invention, the insulating layer on the second metal layer can comprise only one of the first insulating layer 15 and the second insulating layer 16. Furthermore, the pixel electrode 17 can be prepared with any transparent conductive material generally used in the art, for example, transparent conductive oxide such as ITO and IZO. It should be noted that the aforementioned materials for all the layers in the TFT is only one example for the present invention, and the present invention is not particularly limited thereto.

Figure 3B:
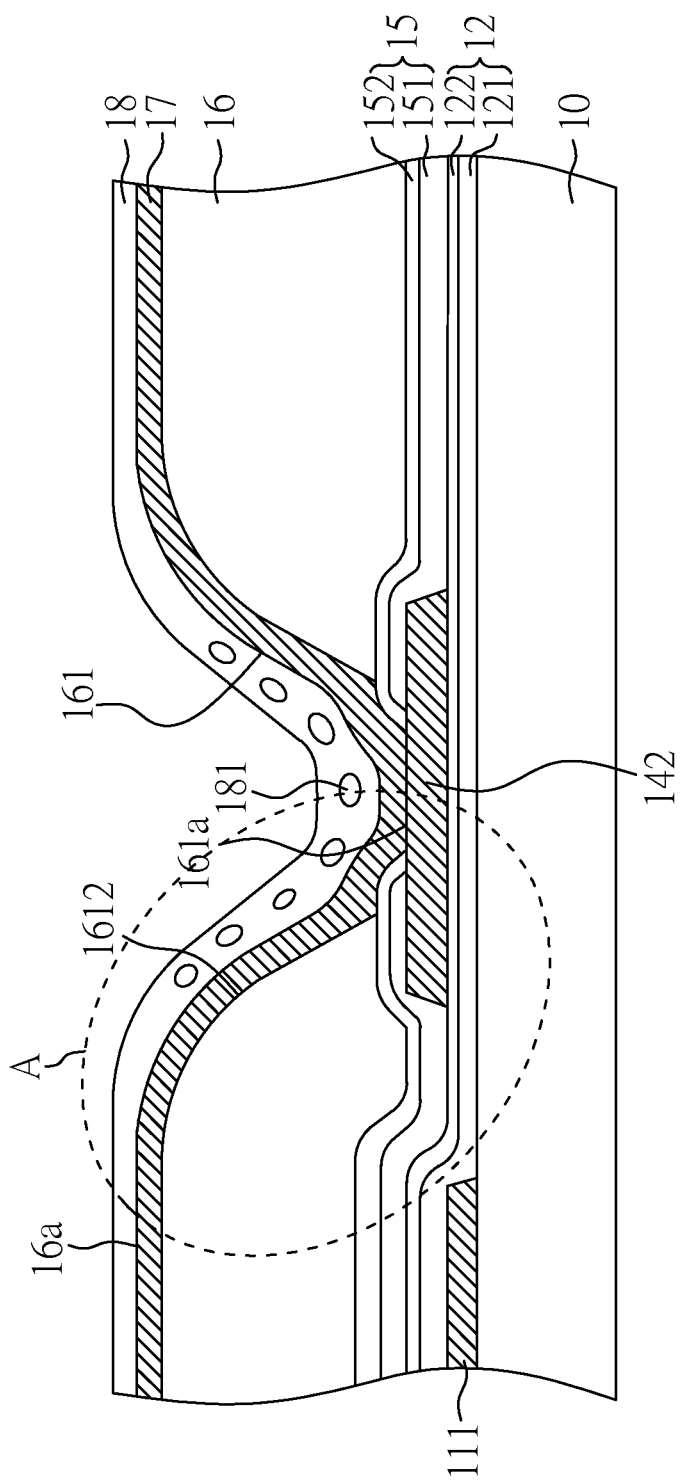

Please refer to FIGS. 3A-3B. In FIG. 3A, the opening size to expose the drain electrode 142 is defined by the opening 1521 of the second protection layer 152. In FIG. 3B, the opening size to expose the drain electrode 142 is defined by the contact via 161 of the second insulating layer 16.

FIGS. 3A-3B are cross-sectional views showing a structure of a contact via exposing a drain electrode along A-A' and B-B' lines indicated in FIG. 2 according to the present embodiment. As shown in FIGS. 2, 3A and 3B, a side wall of the contact via 161 respectively has a first inclined portion 1611 at a first direction X and a second inclined portion 1612 at a second direction Y, and an inclination of the pixel electrode 17 on the first inclined portion 1611 is different from that on the second inclined portion 1612.

Figure 4A:
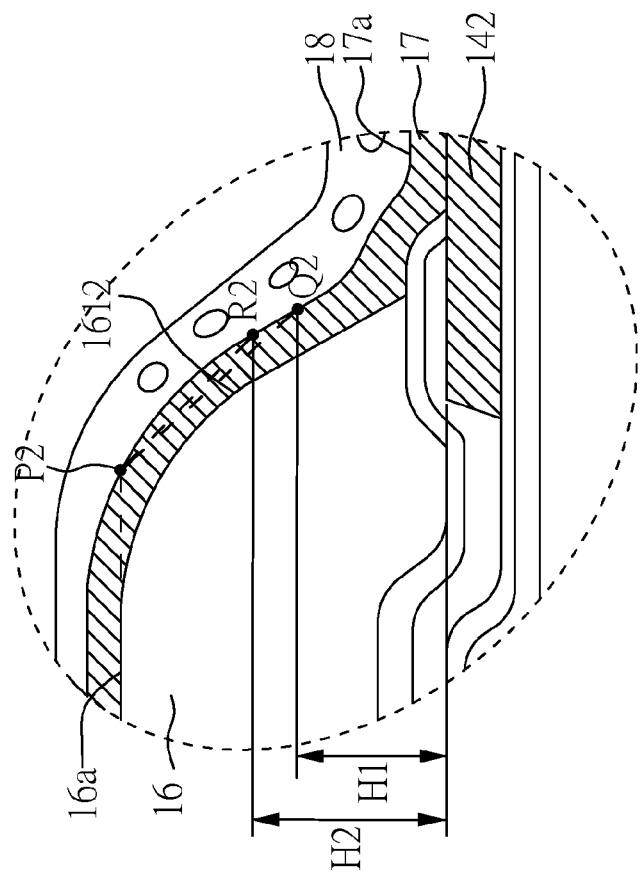
FIGS. 4A-4B are enlarged views showing regions A indicated in FIGS. 3A-3B according to Embodiment 1 of the present invention.
Figure 4B:
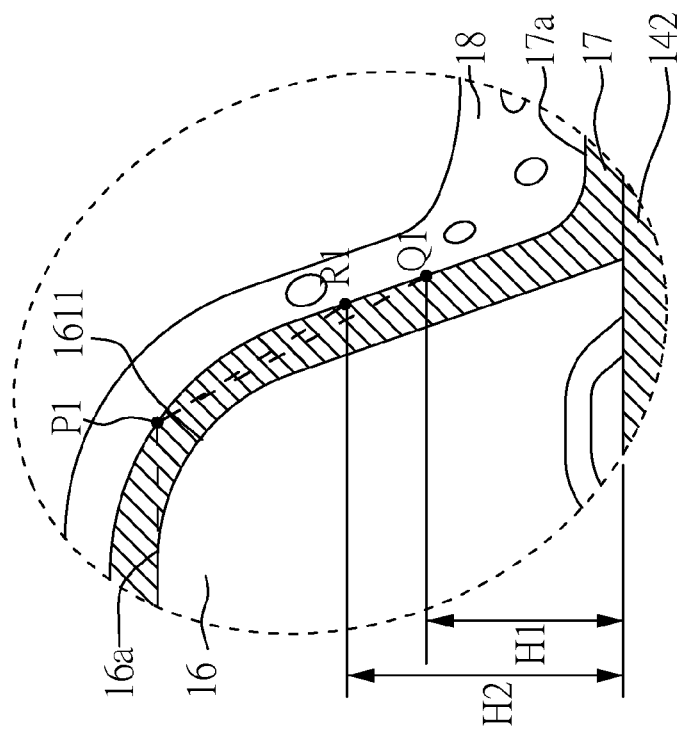

FIGS. 4A-4B are enlarged views showing regions A indicated in FIGS. 3A-3B. As shown in FIGS. 2, 4A and 4B, an inclination of the pixel electrode 17 on the first inclined portion 1611 is larger than that on the second inclined portion 1612.

More specifically, as shown in FIGS. 2, 4A and 4B, a first contact point P1 and a second contact point P2 are respectively formed by crossing an extension line (as shown in the dot line) of an insulating surface 16a of the insulating layer 16 with an electrode surface 17a of the pixel electrode 17 in the contact via 161 at a first direction X and a second direction Y. A first reference point Q1 and a second reference point Q2 are respectively positioned on the electrode surface 17a of the pixel electrode 17 on first inclined portion 1611 and the second inclined portion 1612 at a first predetermined height H1 between the pixel electrode 17 and the drain electrode 14. A slope of the pixel electrode 17 on the first inclined portion 1611 is a connecting line between the first contact point P1 and the first reference point Q1, another slope thereof on the second inclined portion 1612 is another connecting line between the second contact point P2 and the second reference point Q2, and the slope thereof on the first inclined portion 1611 is different from that on the second inclined portion 1612. Preferably, in the present embodiment, a slope of pixel electrode 17 on the first inclined portion 1611 is larger than that on the second inclined portion 1612.

There is not only a slop relation but also a curvature radius relation between the pixel electrode 17 on the first inclined portion 1611 and the second inclined portion 1612. As shown in FIGS. 2, 4A and 4B, at both the first predetermined height H1 and a second predetermined height H2 different from the first predetermined height H1 between the pixel electrode 17 and the drain electrode 14, curvature radii of pixel electrode 17 on the first inclined portion 1411 are different from those on the second inclined portion 1412. Herein, the term "curvature radii" indicate the curvature radii of osculating circles of the electrode surface 17a of the pixel electrode 17 on the first inclined portion 1611 and the second inclined portion 1612 positioned at the first reference point Q1 and the second reference point Q2 on the electrode surface 17a at the first predetermined height H1, and at the third reference point R1 and the third reference point R2 thereon at the second predetermined height H2. Preferably, in the present embodiment, the curvature radii of the pixel electrode 17 on the first inclined portion 1611 are smaller than those on the second inclined portion 1612, at both the first predetermined height H1 and the second predetermined height H2.

In the present embodiment, as shown in FIGS. 2-4B, the pixel electrode is designed to have different inclinations at different direction; and more specifically, the pixel electrode on the first inclined portion and the second inclined portion of the side wall of the contact via is designed to have different inclinations (including the slopes and the curvature radii). Therefore, the problem that light in the contact via has identical reflection angles can be prevented to accomplish the purpose of reducing light leakage.

In addition, as shown in FIGS. 3A and 3B, in the present embodiment, the contact via 161 has a middle bottom portion 161a, the alignment layer 18 is disposed in the contact vias 161, and the alignment layer 181 on the middle bottom portions 161a of the contact vias 161 has a porous structure. Herein, a diameter of a pore 181 in the porous structure can be in a range from 50 nm to 1000 nm. Furthermore, a roughness of the alignment layer 18 disposed on the side walls of the contact vias 161 is different from that of the alignment layer 18 disposed in the middle bottom portion 161a thereof. Herein, the alignment layer 18 can be prepared with any material for the alignment layer generally used in the art such as polyimide (PI). In addition, the presence of the porous structure in the alignment layer 18 and the diameter of the pore 181 in the porous structure of the alignment layer 18 can be adjusted by the selection of the monomer for forming the alignment layer 18 and the polymerization degree thereof.

In the present embodiment, as shown in FIGS. 3A and 3B, the porous structure of the alignment layer in the contact via can reduce light reflection occurred therein to accomplish the purpose of reducing light leakage.

Herein, as shown in FIGS. 3A-4B, only the cross-sections of one contact via are illustrated above. However, in other embodiments of the present invention, the A-A' and B-B' lines indicated in FIG. 2 can be positioned at different contact vias, as long as the pixel electrode and the alignment layer have the aforementioned features.

In addition, as shown in FIGS. 2-4B, only the left side wall of the first inclined portion 1611 and the second inclined portion 1612 of one contact via 161 at the first direction X and the second direction Y are used for comparison in the present embodiment. However, in the present invention, the comparison is not restricted to perform on the inclined portions of the left side wall of one contact via. In other embodiments of the present invention, the inclined portion of one of the left and right side walls of one contact via 161 at the first direction X can be compared with another inclined portion of one of the left and right side walls of another or the same contact via 161 at the second direction Y, as long as the pixel electrodes on the inclined portion have the aforementioned features.

Embodiment 2

The structures of the LCD panel and the TFT substrate of the present embodiment are the same as those illustrated in Embodiment 1, except for the following differences.

First, the active layer of the TFT unit of the present embodiment is prepared with amorphous Si.

Figure 5A:
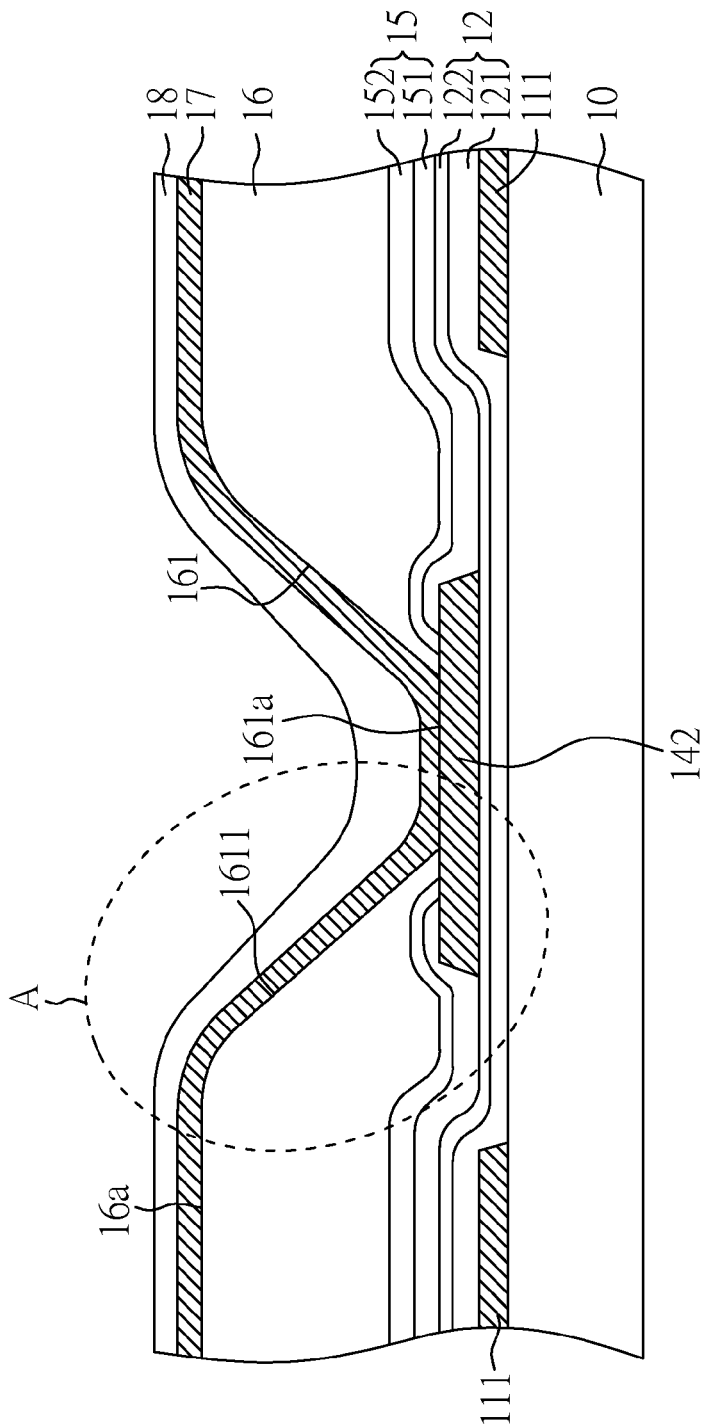
FIGS. 5A-5B are cross-sectional views showing a structure of a contact via exposing a drain electrode along A-A' and B-B' lines indicated in FIG. 2 according to Embodiment 2 of the present invention.
Figure 5B:
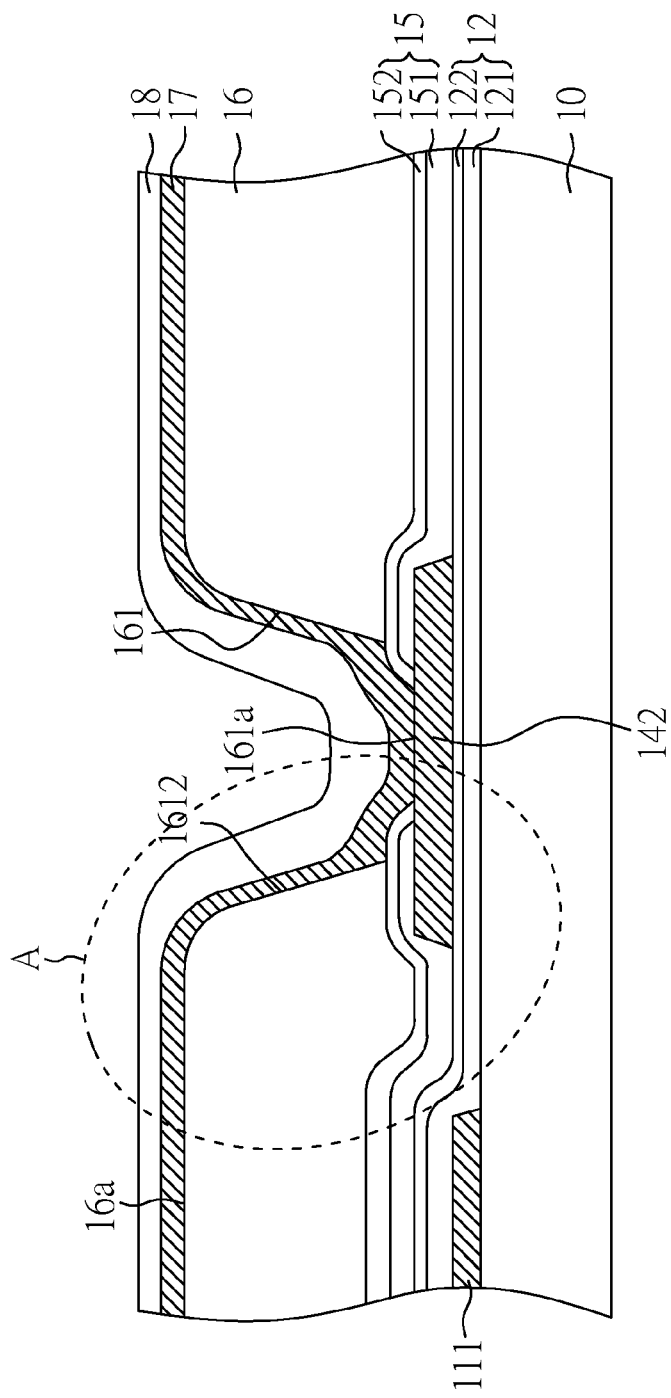
Figure 6A:
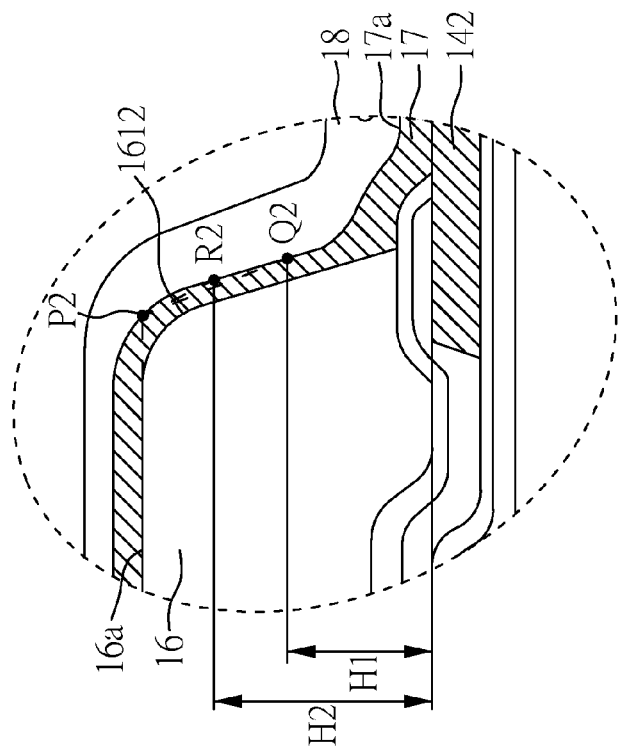
FIGS. 6A-6B are enlarged views showing regions A indicated in FIGS. 5A-5B according to Embodiment 2 of the present invention.
Figure 6B:
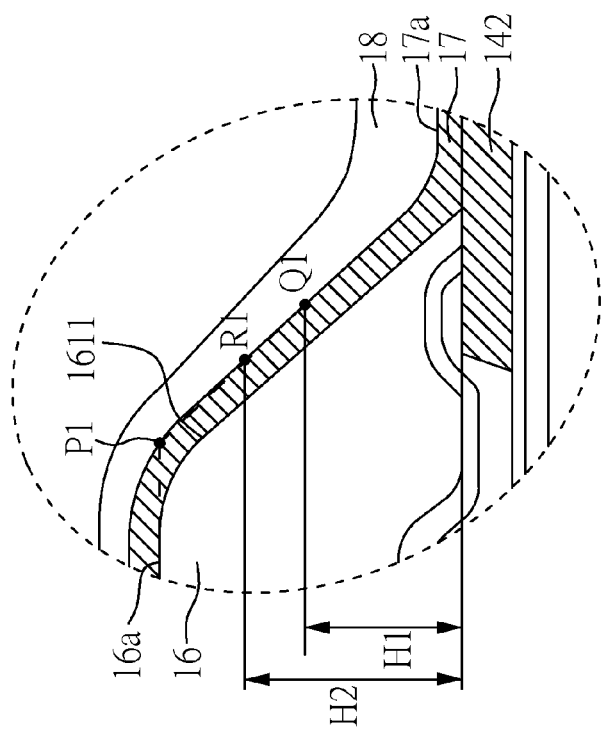

FIGS. 5A-5B are cross-sectional views showing a structure of a contact via exposing a drain electrode along A-A' and B-B' lines indicated in FIG. 2. As shown in FIGS. 5A-5B, in the TFT substrate of the present embodiment, the alignment layer 18 does not have a porous structure. FIGS. 6A-6B are enlarged views showing regions A indicated in FIGS. 5A-5B. As shown in FIGS. 4A, 4B, 6A and 6B, although the first inclined portion 1611 and the second inclined portion 1612 of Embodiment 1 is more curved than those of present embodiment, the TFT substrate of the present embodiment also has the feature that an inclination of the pixel electrode 17 in the contact via 161 on the first inclined portion 1611 at the first direction X is larger than that on the second inclined portion 1612 at the second direction Y. Therefore, the problem that light in the contact via has identical reflection angles can be prevented to accomplish the purpose of reducing light leakage.

In the aforementioned embodiment, only the LCD panel with the TFT substrate and the CF substrate opposite thereto is disclosed, and other LCD panel such as that equipped with a color filter on array (COA) substrate also has the aforementioned features related to the pixel electrode and the alignment layer.

Furthermore, the display device provided by the aforementioned embodiments of the present invention can be applied to any electronic device for displaying images, such as a mobile phone, a notebook, a camera, a video camera, a music player, a navigation system, or a television.

Although the present invention has been explained in relation to its preferred embodiment, it is to be understood that many other possible modifications and variations can be made without departing from the spirit and scope of the invention as hereinafter claimed.

What is claimed is:

1. A thin film transistor (TFT) substrate, comprising:
a substrate;
plural thin film transistor (TFT) units disposed on the substrate and respectively comprising: a gate insulating layer, an active layer, a source electrode and a drain electrode;
an insulating layer disposed on the TFT units and having plural contact vias to respectively expose the drain electrodes of the TFT units;
pixel electrodes disposed on the insulating layer and respectively extending to the contact vias to electrically connect with the drain electrodes; and
an alignment layer covering the pixel electrodes,
wherein a side wall of at least one of the contact vias respectively has a first inclined portion at a first direction and a second inclined portion at a second direction, the first direction is different from the second direction, and an inclination of at least one of the pixel electrodes on the first inclined portion is different from that on the second inclined portion.

2. The TFT substrate as claimed in claim 1, wherein an angle included between the first direction and the second direction is in a range from 85° to 90°.

3. The TFT substrate as claimed in claim 1, wherein an angle included between the first direction and a scan line electrically connecting to the TFT unit is in a range from 0° to 5°, an angle included between the second direction and a data line electrically connecting to the TFT unit is in a range from 0° to 5°, and an inclination of at least one of the pixel electrodes on the first inclined portion is larger than that on the second inclined portion.

4. The TFT substrate as claimed in claim 1, wherein at least one of the contact vias respectively has a middle bottom portion, the alignment layer is disposed in the contact vias, and the alignment layer on at least one of the middle bottom portions of the contact vias has a porous structure.

5. The TFT substrate as claimed in claim 4, wherein a diameter of a pore in the porous structure is in a range from 50 nm to 1000 nm.

6. The TFT substrate as claimed in claim 4, wherein the alignment layer is disposed in the contact vias, and a roughness of the alignment layer disposed on the side walls of the contact vias is different from that of the alignment layer disposed in the middle bottom portion thereof.

7. The TFT substrate as claimed in claim 1, wherein a first contact point and a second contact point are respectively formed by crossing an extension line of an insulating surface of the insulating layer with an electrode surface of the pixel electrode in the contact via at the first direction and the second direction, a first reference point and a second reference point are respectively positioned on the electrode surface of the pixel electrode on the first inclined portion and the second inclined portion at a first predetermined height between the pixel electrode and the drain electrode, a slope of at least one pixel electrode on the first inclined portion is a connecting line between the first contact point and the first reference point, another slope thereof on the second inclined portion is another connecting line between the second contact point and the second reference point, and the slope thereof on the first inclined portion is different from that on the second inclined portion.

8. The TFT substrate as claimed in claim 7, wherein an angle included between the first direction and a scan line electrically connecting to the TFT unit is in a range from 0° to 5°, an angle included between the second direction and a data line electrically connecting to the TFT unit is in a range from 0° to 5°, and a slope of at least one of the pixel electrodes on the first inclined portion is larger than that on the second inclined portion.

9. The TFT substrate as claimed in claim 7, wherein a second predetermined height different from the first predetermined height is positioned between the pixel electrode and the drain electrode, and curvature radii of at least one of the pixel electrodes on the first inclined portion are different from those on the second inclined portion, at both the first predetermined height and the second predetermined height.

10. The TFT substrate as claimed in claim 9, wherein an angle included between the first direction and a scan line electrically connecting to the TFT unit is in a range from 0° to 5°, an angle included between the second direction and a data line electrically connecting to the TFT unit is in a range from 0° to 5°, and curvature radii of at least one of the pixel electrodes on the first inclined portion are smaller than those on the second inclined portion, at both the first predetermined height and the second predetermined height.

11. The TFT substrate as claimed in claim 1, wherein a material of the active layer is IGZO.

12. A TFT substrate, comprising:
    a substrate;
    plural TFT units disposed on the substrate and respectively comprising: a gate insulating layer, an active layer, a source electrode and a drain electrode;
    an insulating layer disposed on the TFT units and having plural contact vias to respectively expose the drain electrodes of the TFT units;
    pixel electrodes disposed on the insulating layer and respectively extending to the contact vias to electrically connect with the drain electrodes; and
    an alignment layer covering the pixel electrodes,
    wherein at least one of the contact vias respectively has a middle bottom portion, the alignment layer is disposed in the contact vias, and the alignment layer on at least one of the middle bottom portions of the contact vias has a porous structure.

13. The TFT substrate as claimed in claim 12, wherein a diameter of a pore in the porous structure is in a range from 50 nm to 1000 nm.

14. The TFT substrate as claimed in claim 12, wherein a roughness of the alignment layer disposed on a side wall of at least one of the contact vias is different from that of the alignment layer disposed in the middle bottom portion thereof.

15. The TFT substrate as claimed in claim 12, wherein a side wall of at least one of the contact vias respectively has a first inclined portion at a first direction and a second inclined portion at a second direction, the first direction is different from the second direction, and an inclination of at least one of the pixel electrodes on the first inclined portion is different from that on the second inclined portion,
    wherein a first contact point and a second contact point are respectively formed by crossing an extension line of an insulating surface of the insulating layer with an electrode surface of the pixel electrode in the contact via at the first direction and the second direction, a first reference point and a second reference point are respectively positioned on the electrode surface of the pixel electrode on the first inclined portion and the second inclined portion at a first predetermined height between the pixel electrode and the drain electrode, the slope of at least one pixel electrode on the first inclined portion is a connecting line between the first contact point and the first reference point, the slope thereof on the second inclined portion is another connecting line between the second contact point and the second reference point, and the slope thereof on the first inclined portion is different from that on the second inclined portion.

16. The TFT substrate as claimed in claim 15, wherein an angle included between the first direction and the second direction is in a range from 85° to 90°.

17. The TFT substrate as claimed in claim 15, wherein an angle included between the first direction and a scan line electrically connecting to the TFT unit is in a range from 0° to 5°, an angle included between the second direction and a data line electrically connecting to the TFT unit is in a range from 0° to 5°, and an inclination of at least one of the pixel electrodes on the first inclined portion is larger than that on the second inclined portion.

18. The TFT substrate as claimed in claim 15, wherein an angle included between the first direction and a scan line electrically connecting to the TFT unit is in a range from 0° to 5°, an angle included between the second direction and a data line electrically connecting to the TFT unit is in a range from 0° to 5°, and a slope of at least one of the pixel electrodes on the first inclined portion is larger than that on the second inclined portion.

19. The TFT substrate as claimed in claim 15, wherein a second predetermined height different from the first predetermined height is positioned between the pixel electrode and the drain electrode, and curvature radii of at least one of the pixel electrodes on the first inclined portion are different from those on the second inclined portion, at both the first predetermined height and the second predetermined height.

20. The TFT substrate as claimed in claim 19, wherein an angle included between the first direction and a scan line electrically connecting to the TFT unit is in a range from 0° to 5°, an angle included between the second direction and a data line electrically connecting to the TFT unit is in a range from 0° to 5°, and curvature radii of at least one of the pixel electrodes on the first inclined portion are smaller than those on the second inclined portion, at both the first predetermined height and the second predetermined height.

21. The TFT substrate as claimed in claim 12, wherein a material of the active layer is IGZO.

* * * * *